United States Patent [19]

Bond et al.

[11] Patent Number: 4,547,710
[45] Date of Patent: Oct. 15, 1985

[54] CATHODE RAY TUBE DISPLAY HORIZONTAL DEFLECTION SYSTEM WITH DELAY COMPENSATION

[75] Inventors: Paul W. Bond; James D. Rockrohr, both of Kingston, N.Y.

[73] Assignee: International Business Corporation, Armonk, N.Y.

[21] Appl. No.: 461,076

[22] Filed: Jan. 26, 1983

[51] Int. Cl.⁴ .................... H01J 29/70; H01J 29/76
[52] U.S. Cl. ................................ 315/403; 315/387
[58] Field of Search ............... 315/387, 388, 389, 370, 315/403, 411

[56] References Cited

U.S. PATENT DOCUMENTS

| | | | |
|---|---|---|---|
| 3,970,894 | 7/1976 | Yasuda et al. | 315/370 |
| 4,292,654 | 9/1981 | Steckler et al. | 315/411 |
| 4,400,652 | 8/1983 | Sunderland | 315/403 |
| 4,400,653 | 8/1983 | Olmstead | 315/387 |

Primary Examiner—Theodore M. Blum
Attorney, Agent, or Firm—James E. Murray

[57] ABSTRACT

The initiation of the flyback interval of a variable format CRT display system is controlled by a frequency independent closed loop compensation circuit. The termination point of a sawtooth pulse, which is initiated at the start of the horizontal sync for the CRT display system, determines the point for the initiation of the flyback interval. The termination point of the sawtooth is compared with the center of the flyback interval. So long as the flyback pulse is perfectly centered on the termination point, the timing is proper. However, if it is off-centered, circuitry results in delaying or advancing the turning off of the horizontal yoke driver to modify the initiation of the flyback interval in a manner to compensate for the change in delay.

5 Claims, 3 Drawing Figures

CATHODE RAY TUBE DISPLAY HORIZONTAL DEFLECTION SYSTEM WITH DELAY COMPENSATION

BACKGROUND OF THE INVENTION

The present invention relates to cathode ray tube (CRT) alpha-numeric displays and more particularly to preventing of drift of alpha-numeric characters on a CRT screen.

It is a requirement of a high resolution display system that the alpha-numeric characters do not undergo short term or long term drift in position on the CRT screen. This drift is caused by variations in delay between the horizontal sync pulse and the occurrence of the flyback interval in the horizontal deflection circuit. The duration of the flyback interval is very stable since it is determined by a stable LC resonant circuit consisting of the deflection yoke and a flyback capacitor that shunts the deflection yoke. The same cannot be said of the initiation of the flyback interval which occurs at the turning off of the horizontal yoke driver. Variations in the initiation time of a flyback interval can be caused by change in circuit or saturation delays caused by excitation voltage changes and temperature changes. In a fixed frequency scan system such as television, these variations in initiation of the flyback interval are usually controlled by a phase-locked-loop circuit. These phase-locked-loop circuits are frequency dependent and therefore impractical in a variable format alpha-numeric display system with a variable frequency scan.

U.S. Patent No. 4,063,133 discloses a frequency dependent horizontal deflection circuit which correct for variations in retrace initiation which are not adjusted by synchronization circuits.

U.S. Patent No. 4,263,615 describes an open loop circuit which synchronizes the horizontal drive sweep with a range of input sync pulse widths.

Therefore, other means need be provided to assure fixed detail between the start of the horizontal sync pulse and the initiation of the flyback interval.

THE INVENTION

In accordance with the present invention, the initiation of the flyback interval of a variable format CRT display system is controlled by a frequency independent closed loop compensation circuit. The termination point of a sawtooth pulse, which is initiated at the start of the horizontal sync, determines the point for the initiation of the flyback interval. The termination point of the sawtooth is compared with the center of the flyback interval. So long as the flyback pulse is perfectly centered on the termination point, the timing is proper. However, if it is off-centered, circuitry results in delaying or advancing the turning off of the horizontal yoke driver to modify the initiation of the flyback interval in a manner to compensate for the change in delay.

Therefore, it is an object of the invention to provide a new control mechanism for maintaining horizontal synchronization.

It is another object of the invention to provide for a control that compensates for delay variations in the initiation of the flyback pulse.

THE DRAWINGS

These and other objects of the invention can be better understood by reference to the accompanying figures of which:

DETAILED DESCRIPTION

Figure 1:
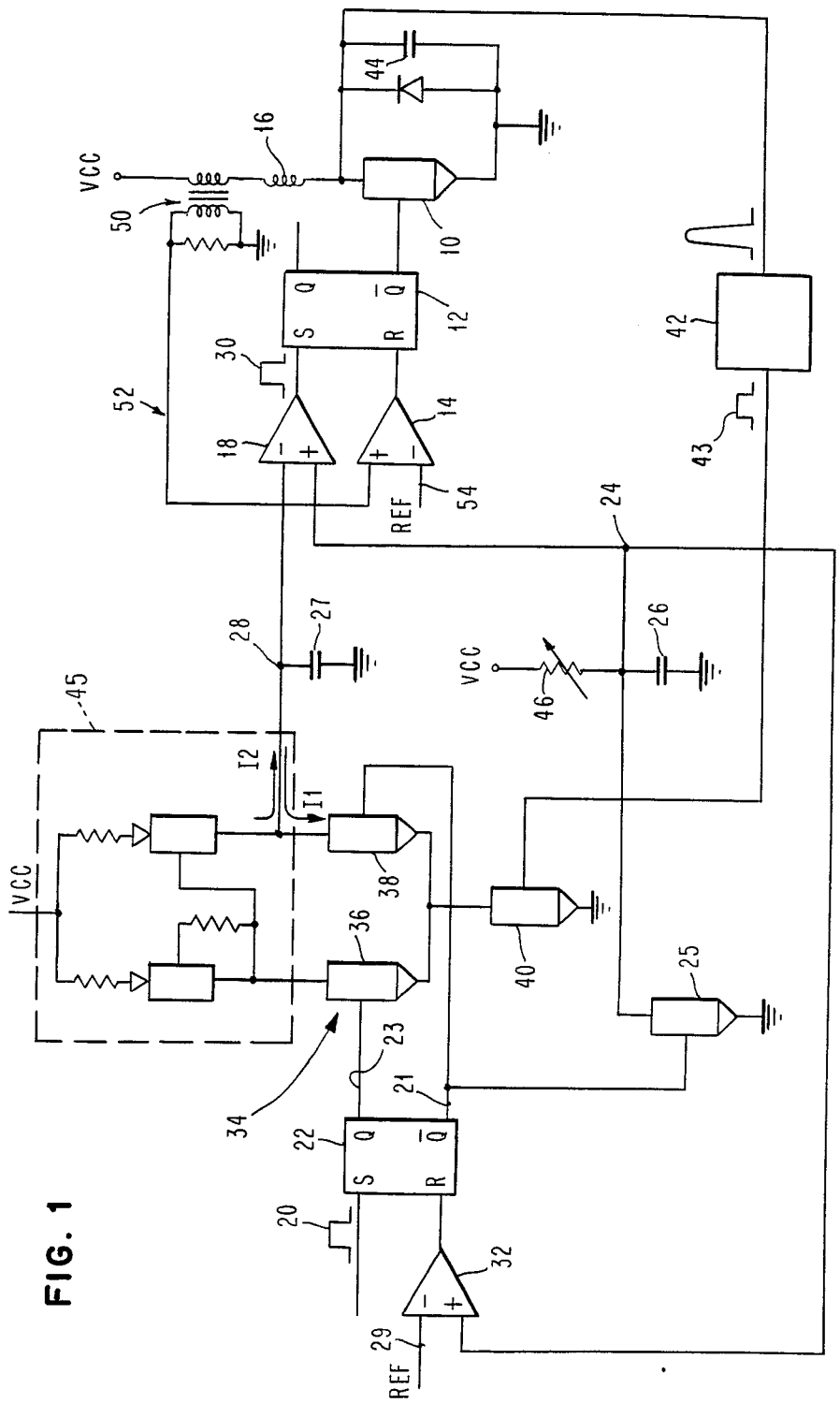
FIG. 1 is an electrical schematic of a flyback pulse synchronization circuit in accordance with the present invention.
Figure 2:
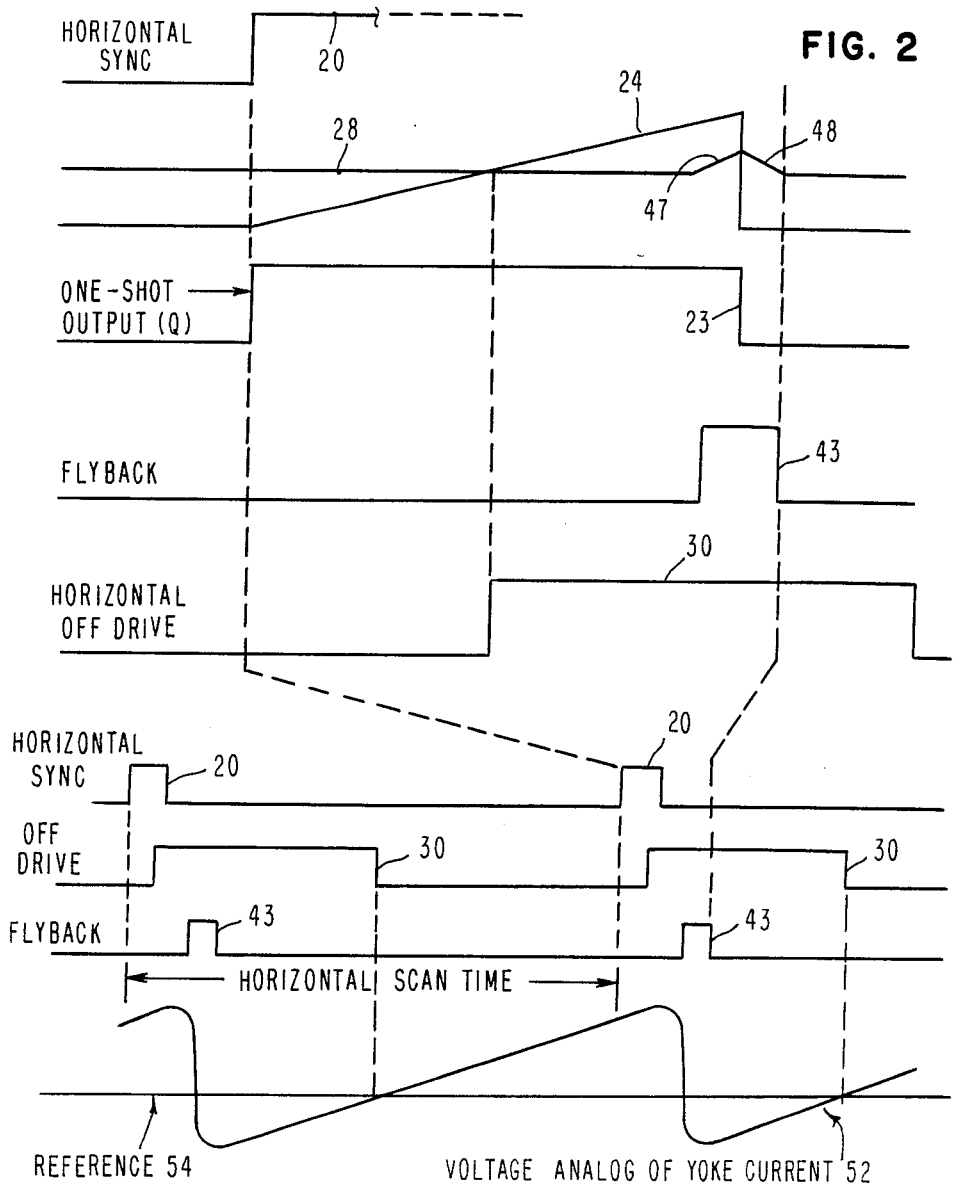
FIG. 2 is a plot of pertinent waveforms of the circuit of FIG. 1.
Figure 3:
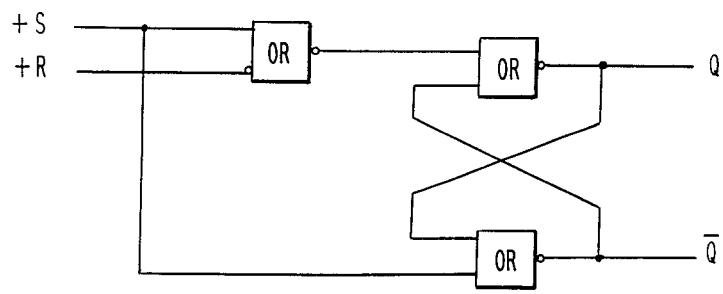
FIG. 3 is a schematic of the set dominant latch shown in FIG. 1.

Referring now to FIGS. 1 and 2, the start of the flyback interval starts with the turning off of the drive transistor 10 for the horizontal deflection yoke coil 16. The input to the drive transistor 10 is taken from the $\overline{Q}$ state output of a latch 12. Latch 12 is a set dominant latch shown in detail in FIG. 3. That is, when the latch set input, S, goes up the latch is totally non-responsive to its reset input, R. When the set input, S, goes down the latch 12 will respond to the output of comparator 14 fed to the reset input R. Comparator 14 compares a voltage which is proportional to the current through the yoke 16, which is generated by current transformer 50, to a reference level and when that voltage exceeds the reference level it provides a positive level at the reset input R of the latch 12. When the set input S is down this raises the $\overline{Q}$ output of the latch 12 causing conduction of transistor 10. The reference level into comparator 14 is set such that the reset input R of latch 12 will raise $\overline{Q}$ and turn on transistor 10 just before it is required to begin conduction. Termination of conduction of the drive transistor 10 and the initiation of the flyback interval is controlled by the set input S.

The signal applied to the set input S of the latch 12 is the output of a second comparator 18. The second comparator 18 produces a positive output level in response to the horizontal sync pulse 20. The horizontal sync pulse 20 is fed into the set inputs of a second latch 22 thereby turning off the $\overline{Q}$ output 21 of the latch 22 and turning on the Q output 23 of the latch 22. When the $\overline{Q}$ output goes down transistor 25 is biased off allowing capacitor 26 to charge and raise the voltage at the positive terminal of comparator 18. As the voltage rises in a ramp 24 it eventually exceeds a variable reference potential at the negative input to comparator 18. When this occurs the output of comparator 18 goes up producing the horizontal off-drive pulse 30. The horizontal off-drive drops the $\overline{Q}$ output of the latch 12 turning off transistor 10 and thereby starting the flyback interval. The voltage 24 continues to rise until it exceeds the reference level 29 fed to the negative input of a third comparator 32. When it does, the reset input of the latch 22 goes up dropping the voltage on the Q input and raising the voltage on the $\overline{Q}$ input. When the $\overline{Q}$ input goes up, transistor 25 conducts shorting capacitor 26 to ground terminating the ramp or sawtooth voltage 24 and with it the horizontal off drive pulse 30. With the horizontal drive pulse down, the latch 12 can again respond to its reset input R and is ready to repeat the described cycle.

So long as half the flyback interval occurs before the termination of the sawtooth and the other half occurs after the termination of the sawtooth flyback interval is properly timed relative to the horizontal sync pulse. To maintain this timing the magnitude of the voltage 28 on capacitor 27 is raised or lowered to advance or retard the start of the horizontal off-drive pulse 30. This is accomplished by using a differential current switch 34. The Q output of latch 22 is fed to the base of transistor 36 and the $\bar{Q}$ output of latch 22 is fed to the base of transistor 38 of this differential current switch 34. The emitters of those two transistors are connected to transistor 40 which is controlled by the output of a pulse shaper 42 that clips an input voltage 43 derived by connecting the input terminal across the flyback capacitor 44 so that the output of the pulse shaper is up when the flyback voltage is up and down when the flyback voltage is down. The load for the differential current switch 34 is a unity current mirror 45 so that $I_1 = I_2$ where $I_2$ is the current charging capacitor 27 when transistors 36 and 40 are both conducting and $I_1$ is the current discharging capacitor 27 when both transistors 38 and 40 are conducting.

If the duration of current $I_1$ and $I_2$ are equal, as is the case when the conduction of transistor 40 is centered in the drop in the sawtooth voltage 26, capacitor 27 will have been charged slightly and then discharged by the same amount to return to its initial charge condition. This is shown at 47, 48 in FIG. 2. If the initiation of flyback is late because of saturation delays in the response of the flyback circuit to off-drive signal 30, the closing of 40 will be delayed and thus current $I_2$ will flow for a shorter period before the switching of 22 terminates it and the flow of current $I_1$ will continue for a correspondingly longer period before being terminated by the reopening of 40. This will decrease the charge across capacitor 27 whereby the ramp 26 will reach voltage level on line 28 sooner, thereby advancing the beginning of the off-drive signal 30. Thus, the circuit will return to a balanced condition wherein the flyback action will be centered about the drop in the sawtooth potential 24. It should be apparent from the above description that the effect of an advance in the initiation of the flyback period would be to increase the potential across capacitor 27 and thereby impede the start of the off-drive pulse 30.

Horizontal centering can be accomplished in a simple manner by making resistance R of the R,C ramp circuit adjustable as indicated at 46 so as to vary the slope of ramp 24. This can be done electronically by circuits responsive to the screen format control (not shown) of the display. Adjustment of the length of the sawtooth and therefore the delay in initiation of the flyback interval is accomplished by changing the reference potential 29 supplied to current switch 32. Increasing the reference potential 29 would have the effect of increasing the delay and decreasing the potential would have the effect of decreasing the delay. The reference potential 29 would be selected so that the length of the sawtooth voltage 24 is equal to the desired delay plus one half the flyback interval 43.

Above we have described one embodiment of our invention. It should be apparent to those skilled in the art that many modifications and changes can be made in this described embodiment without departing from the spirit and scope of the invention as represented in the attached claims.

Having thus described our invention, what we claim as new, and desire to secure by Letters Patent is:

1. An off-drive pulse generation circuit for terminating the drive pulse to a deflection coil of a cathode ray display tube in response to a synchronizing pulse to thereby initiate a flyback interval in the tube comprising:
    (a) sawtooth generation means which generates a fixed length sawtooth voltage initiated by the occurrence of said synchronization pulse
    (b) means responsive to said flyback interval to generate an electrical representation thereof
    (c) comparison means responsive to the time of occurrence of said electrical representation relative to the termination of said sawtooth voltage for producing an electrical analog thereof, and
    (d) pulse generating means responsive to the magnitude of the electrical analog to generate an off-drive pulse which can be either advanced or retarded with respect to a predetermined timed relationship relative to said synchronization pulse to advance or retard the initiation of said flyback interval wherein said pulse generating means includes means comparing the magnitude of said electrical analog relative to said potential of said sawtooth and initiating said off-drive pulse when the potential of said sawtooth first exceeds the magnitude of said electrical analog.

2. The off-drive circuit of claim 1 including means for changing the length of said sawtooth to vary said predetermined timed relationship.

3. The off-drive circuit of claim 2 including means to vary the slope of said sawtooth to control the centering of images on the cathode ray display tube.

4. The off-drive circuit of claim 3 wherein said differential current switch includes
    (a) a first semi-conductor device that conducts current only in response to said electrical representation
    (b) a second semi-conductor device which conducts said current prior to the termination of said sawtooth
    (c) a third semi-conductor device that conducts said current after termination of said sawtooth
    (d) unity current load means which charges said capacitor means when said second semi-conductor device is conducting and effects discharge of said capacitor means when said third semi-conductor device is conducting.

5. An off-drive pulse generation circuit for terminating the drive pulse to a deflection coil of a cathode ray display tube in response to a synchronizing pulse to thereby initiate a flyback interval in the tube comprising:
    (a) sawtooth generation means responsive to said synchronization pulse to generate a sawtooth voltage
    (b) means responsive to said flyback interval to generate an electrical representation thereof
    (c) comparison means responsive to the time of occurrence of said electrical representation relative to the termination of said sawtooth voltage for producing an electrical analog therof, said comparison means including:
        (i) capacitor means for storing the electrical analog thereon;
        (ii) differential current switch means responsive to said electrical representation to charge said capacitor prior to said termination and to discharge said capacitor after said termination; and
    (d) pulse generating means responsive to the magnitude of the electrical analog to generate an off-drive pulse which can be either advanced or retarded with respect to a predetermined timed relationship relative to said synchronization pulse to advance or retard the initiation of said flyback interval, said pulse generation means including means comparing the magnitude of said electrical analog relative to said potential of said sawtooth and initiating said off-drive pulse when the potential sawtooth of said sawtooth first exceeds the magnitude of said electrical analog.

* * * * *